US008522799B2

(12) United States Patent
Freer et al.

(10) Patent No.: US 8,522,799 B2
(45) Date of Patent: *Sep. 3, 2013

(54) APPARATUS AND SYSTEM FOR CLEANING A SUBSTRATE

(75) Inventors: Erik M. Freer, Campbell, CA (US); John M. de Larios, Palo Alto, CA (US); Katrina Mikhaylichenko, San Jose, CA (US); Michael Ravkin, Sunnyvale, CA (US); Mikhail Korolik, San Jose, CA (US); Fred C. Redeker, Fremont, CA (US); Clint Thomas, Milpitas, CA (US); John Parks, Hercules, CA (US)

(73) Assignee: Lam Research Corporation, Fremont, CA (US)

( * ) Notice: Subject to any disclaimer, the term of this patent is extended or adjusted under 35 U.S.C. 154(b) by 1195 days.

This patent is subject to a terminal disclaimer.

(21) Appl. No.: 11/532,493

(22) Filed: Sep. 15, 2006

(65) Prior Publication Data

US 2009/0308413 A1 Dec. 17, 2009

Related U.S. Application Data

(60) Provisional application No. 60/755,377, filed on Dec. 30, 2005.

(51) Int. Cl.
*B08B 3/00* (2006.01)

(52) U.S. Cl.
USPC .......... 134/60; 134/94.1; 134/95.1; 134/95.2; 134/99.1; 15/320

(58) Field of Classification Search
None
See application file for complete search history.

(56) References Cited

U.S. PATENT DOCUMENTS

| | | | |
|---|---|---|---|
| 3,037,887 A | 6/1962 | Brenner et al. | 134/22 |
| 3,212,762 A | 10/1965 | Carroll et al. | 261/124 |
| 3,436,262 A | 4/1969 | Crowe et al. | 134/10 |
| 3,617,095 A | 11/1971 | Lissant | |
| 3,978,176 A | 8/1976 | Voegeli | 261/122 |
| 4,085,059 A | 4/1978 | Smith et al. | 252/118 |

(Continued)

FOREIGN PATENT DOCUMENTS

| | | |
|---|---|---|
| DE | 40-38-587 | 6/1992 |
| EP | 0827188 | 3/1998 |

(Continued)

OTHER PUBLICATIONS

Aubert, Jm et al.; "Aqueous foams"; Scientific America; 1986, 74-82, 254.

(Continued)

*Primary Examiner* — Eric Golightly
(74) *Attorney, Agent, or Firm* — Martine Penilla Group, LLP (57) ABSTRACT

An apparatus for cleaning a substrate is disclosed. The apparatus having a first head unit and a second head unit. The first head unit is positioned proximate to the surface of the substrate and has a first row of channels defined within configured to supply a foam to the surface of the substrate. The second head unit is positioned substantially adjacent to the first head unit and proximate to the surface of the substrate. A second and a third row of channels are defined within the second head unit. The second row of channels is configured to supply a fluid to the surface of the substrate. The third row of channels is configured to apply a vacuum to the surface of the substrate.

8 Claims, 6 Drawing Sheets

(56) References Cited

U.S. PATENT DOCUMENTS

| | | | |
|---|---|---|---|
| 4,133,773 A | 1/1979 | Simmons | 252/359 |
| 4,156,619 A | 5/1979 | Griesshammer | 134/2 |
| 4,238,244 A | 12/1980 | Banks | 134/22 |
| 4,781,764 A | 11/1988 | Leenaars | 134/34 |
| 4,817,652 A | 4/1989 | Liu et al. | 134/102 |
| 4,838,289 A | 6/1989 | Kottman et al. | |
| 4,849,027 A | 7/1989 | Simmons | 134/22 |
| 4,911,761 A | 3/1990 | McConnell et al. | 134/11 |
| 4,962,776 A | 10/1990 | Liu et al. | 134/11 |
| 5,000,795 A | 3/1991 | Chung et al. | 134/37 |
| 5,048,549 A | 9/1991 | Hethcoat | |
| 5,102,777 A | 4/1992 | Lin et al. | 430/331 |
| 5,105,556 A | 4/1992 | Kurokawa et al. | 34/12 |
| 5,113,597 A | 5/1992 | Sylla | 34/22 |
| 5,175,124 A | 12/1992 | Winebarger | 437/180 |
| 5,181,985 A | 1/1993 | Lampert et al. | 156/635 |
| 5,226,969 A | 7/1993 | Watanabe et al. | |
| 5,242,669 A | 9/1993 | Flor | |
| 5,271,774 A | 12/1993 | Leenaars et al. | |
| 5,288,332 A | 2/1994 | Pustilnik et al. | 134/27 |
| 5,306,350 A | 4/1994 | Hoy et al. | 134/22.14 |
| 5,336,371 A | 8/1994 | Chung et al. | 156/659.1 |
| 5,415,191 A | 5/1995 | Mashimo et al. | 134/102.1 |
| 5,417,768 A | 5/1995 | Smith et al. | 134/10 |
| 5,464,480 A | 11/1995 | Matthews | 134/1.3 |
| 5,472,502 A | 12/1995 | Batchelder | 118/52 |
| 5,494,526 A | 2/1996 | Paranjpe | 134/1 |
| 5,498,293 A | 3/1996 | Ilardi et al. | 134/3 |
| 5,656,097 A | 8/1997 | Olesen et al. | 134/1 |
| 5,660,642 A | 8/1997 | Britten | |
| 5,705,223 A | 1/1998 | Bunkofske | |
| 5,800,626 A | 9/1998 | Cohen et al. | |
| 5,858,283 A | 1/1999 | Burris | 261/122.1 |
| 5,900,191 A | 5/1999 | Gray et al. | 261/59 |
| 5,904,156 A | 5/1999 | Advocate, Jr. et al. | 134/2 |
| 5,908,509 A | 6/1999 | Olesen et al. | 134/1.3 |
| 5,911,837 A | 6/1999 | Matthews | 134/2 |
| 5,932,493 A | 8/1999 | Akatsu et al. | 438/745 |
| 5,944,581 A | 8/1999 | Goenka | |
| 5,944,582 A | 8/1999 | Talieh | |
| 5,945,351 A | 8/1999 | Mathuni | |
| 5,951,779 A | 9/1999 | Koyanagi et al. | 134/2 |
| 5,964,954 A | 10/1999 | Matsukawa et al. | |
| 5,964,958 A | 10/1999 | Ferrell | 134/26 |
| 5,968,285 A | 10/1999 | Ferrell et al. | 134/26 |
| 5,997,653 A | 12/1999 | Yamasaka | |
| 6,048,409 A | 4/2000 | Kanno et al. | 134/34 |
| 6,049,996 A | 4/2000 | Freeman | |
| 6,081,650 A | 6/2000 | Lyons et al. | |
| 6,090,217 A | 7/2000 | Kittle | 134/11 |
| 6,092,538 A | 7/2000 | Arai et al. | 134/1.3 |
| 6,152,805 A | 11/2000 | Takahashi | |
| 6,158,445 A | 12/2000 | Olesen et al. | 134/1.3 |
| 6,167,583 B1 | 1/2001 | Miyashita et al. | |
| 6,228,563 B1 | 5/2001 | Starove et al. | |
| 6,267,125 B1 | 7/2001 | Bergman et al. | 134/102.1 |
| 6,270,584 B1 | 8/2001 | Ferrell et al. | 134/26 |
| 6,272,712 B1 | 8/2001 | Gockel et al. | |
| 6,276,459 B1 | 8/2001 | Herrick et al. | 169/14 |
| 6,286,231 B1 | 9/2001 | Bergman et al. | 34/410 |
| 6,290,780 B1 | 9/2001 | Ravkin | |
| 6,296,715 B1 | 10/2001 | Kittle | |
| 6,319,801 B1 | 11/2001 | Wake et al. | 438/585 |
| 6,352,082 B1 | 3/2002 | Mohindra et al. | 134/25.4 |
| 6,386,956 B1 | 5/2002 | Sato et al. | |
| 6,398,975 B1 | 6/2002 | Mertens et al. | |
| 6,401,734 B1 | 6/2002 | Morita et al. | |
| 6,423,148 B1 | 7/2002 | Aoki | 134/3 |
| 6,439,247 B1 | 8/2002 | Kittle | 134/102.1 |
| 6,457,199 B1 | 10/2002 | Frost et al. | |
| 6,491,043 B2 | 12/2002 | Mohindra et al. | 134/25.4 |
| 6,491,764 B2 | 12/2002 | Mertens et al. | |
| 6,493,902 B2 | 12/2002 | Lin | |
| 6,513,538 B2 | 2/2003 | Chung et al. | 134/1.2 |
| 6,514,921 B1 | 2/2003 | Kakizawa | 510/175 |
| 6,527,870 B2 | 3/2003 | Gotkis | |
| 6,532,976 B1 | 3/2003 | Huh et al. | 134/111 |
| 6,537,915 B2 | 3/2003 | Moore et al. | 438/692 |
| 6,554,010 B1 * | 4/2003 | Hirose et al. | 134/153 |
| 6,562,726 B1 | 5/2003 | Torek | 438/745 |
| 6,576,066 B1 | 6/2003 | Namatsu | 134/30 |
| 6,594,847 B1 | 7/2003 | Krusell et al. | |
| 6,616,772 B2 | 9/2003 | de Larios et al. | |
| 6,733,596 B1 | 5/2004 | Mikhaylichenko et al. | 134/60 |
| 6,787,473 B2 | 9/2004 | Andreas | 438/692 |
| 6,797,071 B2 | 9/2004 | Kittle | 134/11 |
| 6,802,911 B2 | 10/2004 | Lee et al. | |
| 6,818,066 B2 * | 11/2004 | Cheung | 118/715 |
| 6,846,380 B2 | 1/2005 | Dickinson et al. | |
| 6,851,435 B2 | 2/2005 | Mertens et al. | |
| 6,874,516 B2 | 4/2005 | Matsuno et al. | |
| 6,896,826 B2 | 5/2005 | Wojtczak et al. | 252/79.1 |
| 6,927,176 B2 | 8/2005 | Verhaverbeke et al. | 438/745 |
| 6,946,396 B2 | 9/2005 | Miyazawa et al. | 438/689 |
| 6,951,042 B1 | 10/2005 | Mikhaylichenko et al. | 15/77 |
| 7,122,126 B1 | 10/2006 | Fuentes | |
| 7,234,477 B2 * | 6/2007 | de Larios et al. | 134/95.2 |
| 7,350,316 B2 * | 4/2008 | Woods et al. | 34/95.2 |
| 7,383,601 B2 * | 6/2008 | Ravkin et al. | 15/77 |
| 2002/0072482 A1 | 6/2002 | Sachdev et al. | 510/175 |
| 2002/0094684 A1 * | 7/2002 | Hirasaki et al. | 438/689 |
| 2002/0121290 A1 | 9/2002 | Tang et al. | |
| 2002/0185164 A1 | 12/2002 | Tetsuka et al. | |
| 2002/0195121 A1 | 12/2002 | Kittle | |
| 2003/0075204 A1 | 4/2003 | de Larios et al. | |
| 2003/0148903 A1 | 8/2003 | Bargaje et al. | |
| 2003/0171239 A1 | 9/2003 | Patel et al. | |
| 2003/0226577 A1 | 12/2003 | Orll et al. | |
| 2004/0002430 A1 | 1/2004 | Verhaverbeke | 510/175 |
| 2004/0053808 A1 | 3/2004 | Raehse et al. | |
| 2004/0069329 A1 * | 4/2004 | de Larios et al. | 134/95.2 |
| 2004/0134515 A1 | 7/2004 | Castrucci | 134/2 |
| 2004/0159335 A1 | 8/2004 | Montierth et al. | |
| 2004/0163681 A1 | 8/2004 | Verhaverbeke | 134/28 |
| 2004/0261823 A1 | 12/2004 | de Larios | |
| 2005/0045207 A1 | 3/2005 | Nitta et al. | |
| 2005/0132515 A1 | 6/2005 | Boyd et al. | |
| 2005/0133060 A1 | 6/2005 | de Larios et al. | |
| 2005/0133061 A1 | 6/2005 | de Larios et al. | |
| 2005/0159322 A1 | 7/2005 | Min et al. | 510/175 |
| 2005/0176606 A1 | 8/2005 | Konno et al. | |
| 2005/0183740 A1 | 8/2005 | Fulton et al. | 134/3 |
| 2005/0217703 A1 | 10/2005 | O'Donnell | 134/21 |
| 2006/0201267 A1 | 9/2006 | Liu | |
| 2006/0283486 A1 | 12/2006 | de Larios et al. | |
| 2006/0285930 A1 | 12/2006 | de Larios et al. | 406/197 |
| 2007/0000518 A1 | 1/2007 | de Larios et al. | |

FOREIGN PATENT DOCUMENTS

| | | |
|---|---|---|
| EP | 0905746 | 3/1999 |
| EP | 11-334874 | 12/1999 |
| EP | 0989600 | 3/2000 |
| EP | 1080797 | 3/2001 |
| EP | 1803503 A2 * | 7/2007 |
| JP | 53-076559 | 7/1978 |
| JP | 56-084619 | 7/1981 |
| JP | 59-24849 | 2/1984 |
| JP | 60-005529 | 1/1985 |
| JP | 62-119543 | 5/1987 |
| JP | 63-077510 | 4/1988 |
| JP | 02-309638 A | 12/1990 |
| JP | 5-15857 | 1/1993 |
| JP | 06-177101 | 6/1994 |
| JP | 07-006993 | 1/1995 |
| JP | 11-350169 | 12/1999 |
| JP | 2001-064688 | 3/2001 |
| JP | 2002-66475 | 3/2002 |
| JP | 2002-280330 A | 9/2002 |
| JP | 2002-309638 | 10/2002 |
| JP | 2003 151948 A | 5/2003 |
| JP | 2003-282513 | 10/2003 |
| JP | 2005-194294 | 7/2005 |
| WO | WO-99/16109 | 4/1999 |
| WO | WO-00/33980 | 6/2000 |

| | | |
|---|---|---|
| WO | WO-00/59006 | 10/2000 |
| WO | WO-01/12384 | 2/2001 |
| WO | WO-02/101795 | 12/2002 |
| WO | WO-2005/006424 | 1/2005 |
| WO | WO 2005/064647 A1 | 7/2005 |

OTHER PUBLICATIONS

Kittle, et al.; "Semiconductor Wafer Cleaning and Drying Using a Foam Medium"; <hhttp://www.aquafoam.com/papers;SCI0202.pdf>; Sematech Novel Wafer Cleans Working Group Meeting, Internet Presetation; Nov. 13, 2001.

Hunter; "Introduction to Modern Colloid Science"; Oxford University Press; Feb. 1, 1994.

Lester; "Is Foam Wafer Cleaning and Drying the Future?"<http://www.aquafoam.com/papers/SCI0202.pdf>; Semiconductor International, 25, #2; Feb. 1, 2002.

Kirkpatrick et al.; "Advanced Wafer-Cleaning Evolution"; Solid State Technology; May 1, 2003; www.solid-state.com.

Weaire et al.; "The Physics of Foams"; Department of Physics; Trinity Collage, Dublin; 1999.

Kittle, et al.; "Photoresist Residue Removal Using Aqueous Foam Proof of Concept Experiments"; Internet; http://www.aquafoam.com/paper/Proof-11MB.pdt<papers/A2C2photoresist.pdf>; 13-17; May 1, 2002.

Lide; "Air Composition"; CRC handbook of Chemistry and Physics; 1997.

U.S. Appl. No. 11/639,752, filed Dec. 15, 2006, Boyd et al.

U.S. Appl. No. 11/743,283, filed May 2, 2007, Freer et al.

* cited by examiner

APPARATUS AND SYSTEM FOR CLEANING A SUBSTRATE

APPLICATION FOR CLAIM OF PRIORITY

This application claims the benefit of U.S. Provisional Application No. 60/755,377, filed Dec. 30, 2005. The disclosure of the above-identified application is incorporated herein by reference.

CROSS REFERENCE TO RELATED APPLICATIONS

This application is related to U.S. patent application Ser. No. 11/532,491, filed on the same date as the instant application, and entitled "method and material for cleaning a substrate", which is hereby incorporated by reference.

This application is also related to U.S. patent application Ser. No. 10/816,337, filed on Mar. 31, 2004, and entitled "Apparatuses and Methods for Cleaning a Substrate," U.S. patent application Ser. No. 11/153,957, filed on Jun. 15, 2005, and entitled "Method and Apparatus for Cleaning a Substrate Using Non-Newtonian Fluids," U.S. patent application Ser. No. 11/154,129, filed on Jun. 15, 2005, and entitled "Method and Apparatus for Transporting a Substrate Using Non-Newtonian Fluid," U.S. patent application Ser. No. 11/174,080, filed on Jun. 30, 2005, and entitled "Method for Removing Material from Semiconductor Wafer and Apparatus for Performing the Same," U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids," U.S. patent application Ser. No. 11/336,215, filed on Jan. 20, 2006, entitled "Method and Apparatus for removing contamination from a substrate," U.S. patent application Ser. No. 11/346,894, filed on Feb. 3, 2006, entitled "Method for removing contamination from a substrate and for making a cleaning solution," and U.S. patent application Ser. No. 11/347,154, filed on Feb. 3, 2006, entitled "Cleaning compound and method and system for using the cleaning compound." The disclosure of each of the above-identified related applications is incorporated herein by reference.

BACKGROUND

In the fabrication of semiconductor devices such as integrated circuits, memory cells, and the like, a series of manufacturing operations are performed to define features on semiconductor wafers ("wafers"). The wafers are processed to include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contamination from the wafer surface in a substantially complete manner without damaging the features defined on the wafer. However, the size of particulate contamination is often on the order of the critical dimension size of features fabricated on the wafer. Removal of such small particulate contamination without adversely affecting the features on the wafer can be quite difficult.

Conventional wafer cleaning apparatuses, systems, and methods have relied heavily on mechanical force to remove particulate contamination from the wafer surface. As feature sizes continue to decrease and become more fragile, the probability of feature damage due to application of mechanical force to the wafer surface increases. For example, features having high aspect ratios are vulnerable to toppling or breaking when impacted by a sufficient mechanical force. To further complicate the cleaning problem, the move toward reduced feature sizes also causes a reduction in the size of particulate contamination. Particulate contamination of sufficiently small size can find its way into difficult to reach areas on the wafer surface, such as in a trench surrounded by high aspect ratio features. Thus, efficient and non-damaging removal of contaminants during modern semiconductor fabrication represents a continuing challenge to be met by continuing advances in wafer cleaning technology. It should be appreciated that the manufacturing operations for flat panel displays suffer from the same shortcomings of the integrated circuit manufacturing discussed above.

In view of the forgoing, there is a need for a more effective and less abrasive cleaning apparatuses, systems, and methods for cleaning wafer surfaces.

SUMMARY

Broadly speaking, the present invention fills these needs by providing improved apparatuses, systems, and methods for cleaning wafer surfaces. It should be appreciated that the present invention can be implemented in numerous ways, including as an apparatus, a method and a system. Several inventive embodiments of the present invention are described below.

In one embodiment, an apparatus for cleaning a substrate is disclosed. The apparatus having a first head unit and a second head unit. The first head unit is positioned proximate to the surface of the substrate and has a first row of channels defined within configured to supply a foam to the surface of the substrate. The second head unit is positioned substantially adjacent to the first head unit and proximate to the surface of the substrate. A second and a third row of channels are defined within the second head unit. The second row of channels is configured to supply a fluid to the surface of the substrate. The third row of channels is configured to apply a vacuum to the surface of the substrate.

In another embodiment, a method for cleaning a substrate is disclosed. A substrate with a particle deposited thereon is provided. A foam including a plurality of tri-state bodies each having a solid portion, liquid portion, and a gas portion is generated. The foam is applied to the surface of the substrate through a first set of applicators. A fluid is applied to the surface of the substrate through a second set of applicators in sufficient quantity to substantially remove the foam from the surface of the substrate. A vacuum is applied to the surface of the substrate through a third set of applicators to substantially remove the fluid from the surface of the substrate.

In still another embodiment, an apparatus for cleaning a substrate is disclosed. The apparatus includes a containment conduit, a plurality of supports, an inlet end valve, and an outlet end valve. The containment conduit is configured to apply a pressure on a foam passing across a surface for the substrate establishing a flow for the foam from the inlet end to the outlet end. The plurality of supports are enclosed within the containment conduit and are configured to support the substrate. The inlet end valve and the outlet end valve are configured to regulate the flow of foam into and out of the containment conduit. A controller in communications with the inlet end valve and outlet end valve controls the flow of foam through the containment conduit.

In still yet another embodiment, a method for cleaning a substrate is disclosed. A substrate with a particle deposited thereon is inserted into a containment conduit. A foam supplied to the containment conduit through an inlet valve of the containment conduit. A pressure is applied through the inlet valve of the containment conduit to establish a pressure-driven flow for the foam such that the foam moves across the surface of the substrate and interacts with the particle on the surface of the substrate. The foam is removed along with the particle from the containment conduit through the outlet valve of the containment conduit.

In still another embodiment, a system for cleaning a substrate is disclosed. The system includes a first cleaning zone, a second cleaning zone and a carrier capable of holding the substrate. The first cleaning zone includes a pressure-driven flow unit configured to apply a foam to a surface of the substrate. The second cleaning zone includes an applicator that is configured to dispense a fluid to substantially remove the foam from the surface of the substrate. The carrier is configured to transport the substrate translationally from the first cleaning zone to the second cleaning zone.

In yet still another embodiment, a system for cleaning a substrate is disclosed. The system includes a fluid dispenser, a foam dispenser and a rotating chuck. The fluid dispenser is positioned proximate to a surface of the substrate and is configured to deliver a fluid to the surface of the substrate. The foam applicator is positioned proximate to the surface of the substrate and is configured to supply a foam to the surface of the substrate. The rotating chuck is configured to support and impart a rotational velocity to the substrate while a plurality of grippers are used to secure the substrate onto the rotating chuck.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for apparatuses, systems, and methods for cleaning wafer surfaces. It will be obvious, however, to one skilled in the art, that the present invention may be practiced without some or all of these specific details. In other instances, well known process operations have not been described in detail in order not to unnecessarily obscure the present invention.

As used herein, a tri-state body cleaning material contains a plurality of tri-state bodies that include a gas portion, a liquid portion and a solid portion. In one embodiment, the gas portion and liquid portion provides an intermediary to bring the solid portion into close proximity with contaminant particles on a substrate surface. Some exemplary types of materials that can be used to make up the solid portion includes aliphatic acids, carboxylic acids, paraffin, wax, polymers, polystyrene, polypeptides, and other visco-elastic materials. The solid portion material should be present at a concentration that exceeds its solubility limit within the liquid portion. Also, it should be understood that the cleaning effectiveness associated with a particular solid portion material may vary as a function of, concentration, temperature, pH, and other environmental conditions.

The aliphatic acids represent essentially any acid defined by organic compounds in which carbon atoms form open chains. A fatty acid is an example of an aliphatic acid that can be used as the solid portion within the tri-state body cleaning material. Examples of fatty acids that may be used as the solid portion include lauric acid, palmitic acid, stearic acid, oleic acid, linoleic acid, linolenic acid, arachidonic acid, gadoleic acid, eurcic acid, butyric acid, caproic acid, caprylic acid, myristic acid, margaric acid, behenic acid, lignoseric acid, myristoleic acid, palmitoleic acid, nervanic acid, parinaric acid, timnodonic acid, brassic acid, clupanodonic acid, lignoceric acid, cerotic acid, and mixtures thereof, among others.

For further explanation of the composition of the tri-state body cleaning material and its mechanisms see U.S. patent application Ser. No. (11/346,894), filed on Feb. 3, 2006, entitled "METHOD FOR REMOVING CONTAMINATION FROM A SUBSTRATE AND FOR MAKING A CLEANING SOLUTION," U.S. patent application Ser. No. (11/347,154), filed on Feb. 3, 2006, entitled "CLEANING COMPOUND AND METHOD AND SYSTEM FOR USING THE CLEANING COMPOUND" and U.S. patent application Ser. No. 11/336,215, filed on Jan. 20, 2006, entitled "METHOD AND APPARATUS FOR REMOVING CONTAMINATION FROM A SUBSTRATE." The solid phase interacts with the particles during cleaning to effectuate their removal. A substrate, as used herein, denotes semiconductor wafers, flat panel display surfaces (e.g., liquid crystal displays, etc.), and wafer handling equipment and hardware that may become contaminated during manufacturing operations.

Figure 1A:
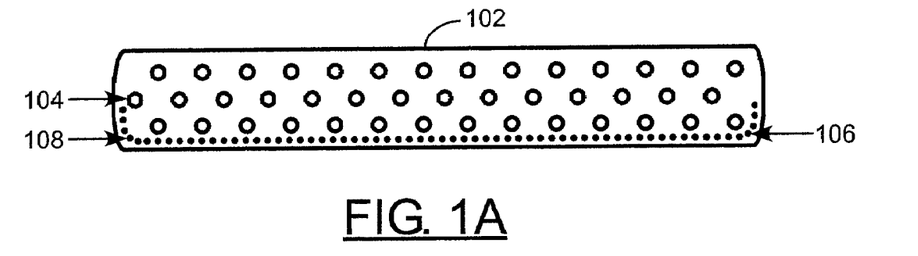
FIG. 1A is an illustration of the bottom surface of a proximity head unit for cleaning a substrate surface, in accordance with one embodiment of the present invention.

FIG. 1A is an illustration of the bottom surface of a proximity head unit for cleaning a substrate surface, in accordance with one embodiment of the present invention. In this depiction, a proximity head unit 102 is shown with a plurality of tri-state body dispensing outlets 104 for dispensing a tri-state body cleaning material, a plurality of fluid dispensing outlets 106 for dispensing a fluid, and a plurality of vacuum openings 108 for applying a vacuum to the surface of a substrate.

In one embodiment, the tri-state body dispensing outlets 104, fluid dispensing outlets 106, and vacuum openings 108 are sequentially arranged in rows lengthwise across the surface of a proximity head unit 102 configured to provide coverage over the entire diameter of a substrate. For example, the first three rows of outlets on the proximity head unit 102 may be the tri-state body dispensing outlets 104 followed by two rows of fluid dispensing outlets 106 and then two rows of vacuum openings 108. It should be understood, that this is just one example of a possible configuration for how the various types of outlets/openings can be arranged on the proximity head unit 102, in practice there are a myriad of configurations having different outlet/opening types, different sequences of outlet/opening types, and the number of rows that can be assigned for each outlet/opening type. The outlet/opening configurations are only limited by the requirements of the application, the number of outlets/openings that the proximity head unit 102 can be configured to house and the types of outlets/openings that can be included as part of the head unit 102.

In one embodiment, the tri-state body dispensing outlets 104 are configured to supply a tri-state body cleaning material to the surface of a substrate. The tri-state body cleaning material may be either a foam or an emulsion that includes a plurality of tri-state bodies. In one embodiment, the fluid dispensing outlets 106 are configured to dispense a liquid to the surface of the substrate. Examples of some types of liquids that can be dispensed include De-ionized Water (DIW), Ammonium Peroxide ($NH_4OH$), Hydrogen Peroxide ($H_2O_2$), SC-1 solution ($NH_4OH/H_2O_2/H_2O$), de-foaming agents, etc. However, it should be understood that essentially any liquid can be used as longs as the liquid can adequately remove the tri-state body cleaning material from the substrate surface per the requirements of the application. In another embodiment, the fluid dispensing outlets 106 are configured to dispense a gas to the surface of the substrate. Examples of some types of gases that can be dispensed by the fluid dispenser outlets 106 include isopropyl alcohol (IPA) vapor, carbon dioxide (CO2), air, nitrogen ($N_2$), argon (Ar), oxygen ($O_2$), ozone ($O_3$), etc. Essentially any type of gas can be dispensed as long as the gas can be used to adequately dry the substrate surface without damaging the multi-level structures defined on the substrate surface. In one embodiment, the vacuum openings are configured to apply a vacuum to the surface of the substrate. The vacuum pressure settings being optimized to substantially remove any tri-state body cleaning material and/or liquids that are deposited on the surface of the substrate.

Figure 1B:
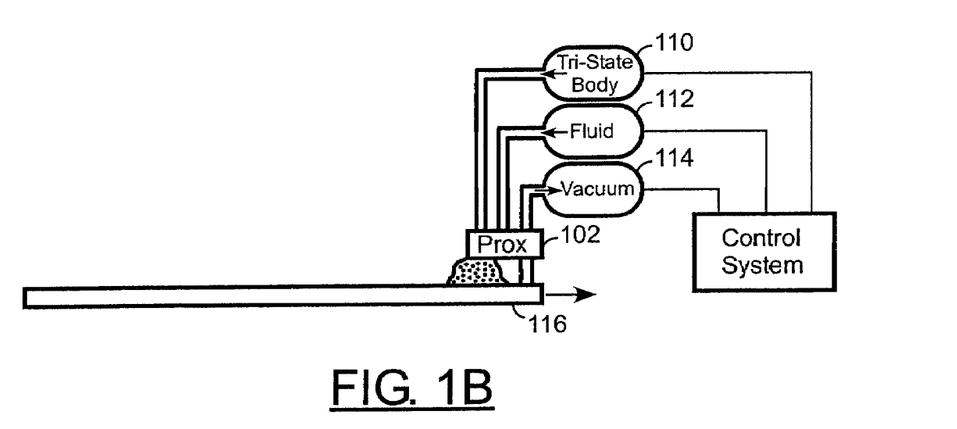
FIG. 1B is a side view illustration of a proximity head unit for cleaning a substrate surface, in accordance with one embodiment of the present invention.

FIG. 1B is a side view illustration of a proximity head unit for cleaning a substrate surface, in accordance with one embodiment of the present invention. As depicted herein, a proximity head unit 102 with a tri-state body material (i.e., foam) supply line 110, a fluid supply line 112, and a vacuum supply line 114 is shown as positioned proximate to the top surface of a substrate 116 while the substrate 116 moves translationally under the proximity head unit 102. As discussed above, the tri-state body cleaning material can either be dispensed as a foam or an emulsion depending on the application and the chemical composition of the tri-state body cleaning material.

As shown, the surface of the substrate 116 is initially treated with the tri-state body cleaning material followed by de-ionized water to rinse off the cleaning material, and then a vacuum is applied to remove the de-ionized water from the surface. In one embodiment, a second proximity head unit is positioned proximate to the bottom surface of the substrate 116 and is substantially aligned with the top proximity head unit 102. The second proximity head unit being configured to treat the bottom surface of the substrate 116 with the tri-state body cleaning material and deionized water followed by drying with an application of the vacuum.

Figure 2A:
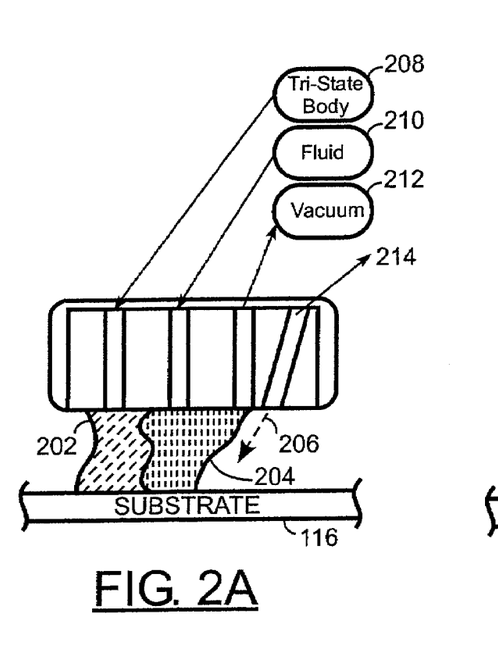
FIGS. 2A and 2B are enlarged cross-sectional views of proximity head units for cleaning a substrate surface, in accordance with one embodiment of the present invention.

FIG. 2A is an enlarged cross-sectional view of a proximity head unit for cleaning a substrate surface, in accordance with one embodiment of the present invention. In this depiction, the proximity head unit 102 is shown with a plurality of channels that extend from inlets/ports on the top surface of the proximity head 102 through to the outlets/openings on the bottom surface of the proximity head 102. As shown, the proximity head unit 102 includes a tri-state body cleaning material inlet 208 to supply a tri-state body cleaning material 202 to the channel configured to deliver the material 202 to the substrate surface through a tri-state body cleaning material 202 outlet, a fluid inlet 210 to supply a fluid (e.g., de-ionized water/de-foaming agent, etc.) to the channel configured to deliver the fluid in the form of a fluid meniscus 204 to the substrate surface, a vacuum inlet 212 to supply a vacuum to the channel configured to apply the vacuum against the substrate 116 surface, and a gas supply inlet 214 to supply a gas 206 (e.g., IPA vapor, $CO_2$, $N_2$, $O_2$, etc.) through the channel configured to supply the gas 206 to the substrate 116 surface. In one embodiment, the substrate 116 moves translationally under the proximity head unit 102 during a cleaning operation where the tri-state body cleaning material, fluid, vacuum and gas are supplied to or applied against the substrate 116 surface. In another embodiment, the proximity head unit 102 is configured to move translationally over the surface of the substrate 116 during the cleaning operation. In one embodiment, a control system (as shown in FIG. 1B) may be provided. The control system is configured to manage the flow of fluids to and from the proximity head unit 102. The managing of the fluid flow may include flow meters and controllers to ensure that a proper meniscus is formed. In one embodiment, the meniscus is maintained between the proximity head unit 102 and the surface of the substrate 116. This ensures precise control of the cleaning fluids and tri-state body.

Figure 2B:
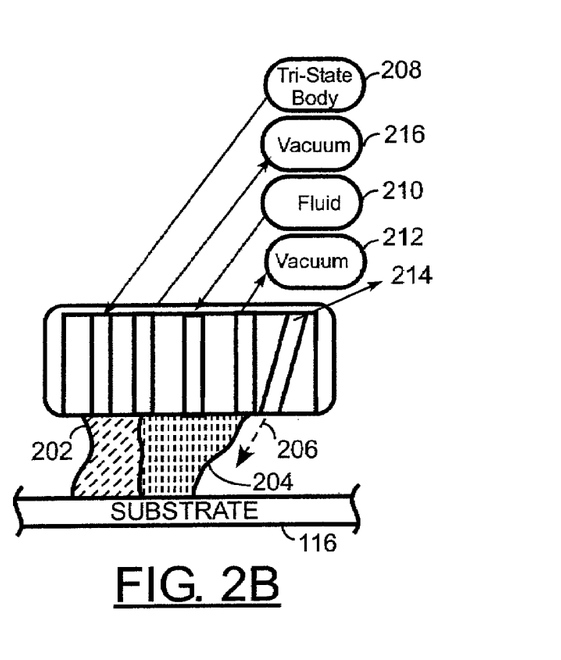

FIG. 2B illustrates another configuration, where a vacuum inlet 216 is provided to enable the application of a vacuum to the tri-state body cleaning material 202 and the fluid 204. In this embodiment, the vacuum inlet 216 may be in the form of a plurality of discrete manifolds (e.g., holes or ports), that will enable a better interface between the material 202 and the fluid 204. In one embodiment, it is envisioned that the vacuum inlet 216, which provides a better interface, will assist in reducing the amount of mixing between the material 202 and the fluid 204. Depending on the degree of mixing desired, for the given application, the vacuum inlet 216 can be controlled (e.g., by pumps and computer/program controls). Each recipe will therefore define a different degree of tuning of the tristate body 208, vacuum 216, fluid 210, vacuum 212 and gas 206.

It should therefore be understood that the proximity head unit 102 can have many different configurations and that this is but one exemplary configuration. Other proximity head 102 configurations may include different types and numbers of channels as required by the particular application that the proximity head unit 102 is being used for.

Figure 3:
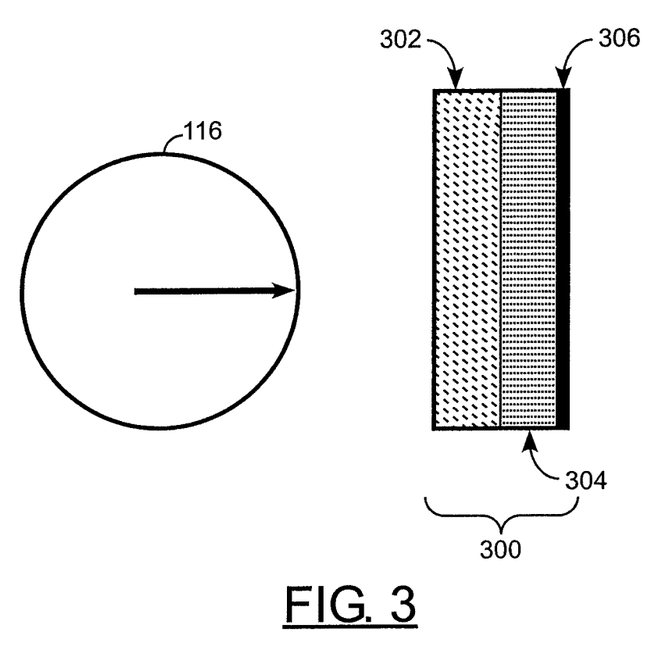
FIG. 3 is a top-view of an integrated cleaning apparatus for cleaning a substrate surface, in accordance with one embodiment of the present invention.

FIG. 3 is a top-view of an integrated cleaning apparatus for cleaning a substrate surface, in accordance with one embodiment of the present invention. As shown, therein, a substrate 116 moves translationally towards the integrated cleaning apparatus 300, which includes a tri-state body cleaning material dispensing portion 302, a proximity head portion 304, and a gas dispensing portion 306. The tri-state body cleaning material dispensing portion 302 is configured to supply the tri-state body cleaning material to the substrate 116 surface as the substrate 116 moves translationally under the integrated cleaning apparatus 300 or the cleaning apparatus 300 moves translationally over the substrate 116 surface. The cleaning material can either be in the form of a tri-state body foam or an emulsion. In one embodiment, the tri-state body dispensing portion 302 is configured to supply the tri-state body cleaning material with sufficient force to promulgate interactions between the solid portions of the cleaning material and contaminant particles on the substrate 116 surfaces. For example, the cleaning material can be dispensed so that a downward force (or force in general) is applied against the tri-state bodies that are positioned substantially adjacent to the substrate 116 surface such that the solid portions of those tri-state bodies interact with contaminant particles deposited on the substrate 116 surface. In cases where the wafer is not horizontal, the force may not be a downward force, but instead is a force that is relative to the position of the wafer. The interactions between the solid portions of the tri-state bodies and the contaminant particles results in the particle being removed from the surface of the substrate 116 as the tri-state bodies are removed. These interactions may be established through one or more mechanisms including adhesion, collision, and attractive forces.

The proximity head portion 304 includes outlets for applying a liquid meniscus onto the surface of the substrate 116 and openings for applying a vacuum against the substrate 116 surface. During a substrate 116 cleaning operation, the proximity head portion 304 is configured to effectuate the removal the tri-state body cleaning material and associated contaminant particles from the surface of the substrate 116. The liquid meniscus and substrate 116 surface boundary is defined by an area where there is a rapid exchange of liquid that results in the substantial removal of cleaning material from the substrate 116 surface. Examples of some types of liquids that can be used include De-ionized Water (DIW), Ammonium Peroxide ($NH_4OH$), Hydrogen Peroxide ($H_2O_2$), SC-1 solution ($NH_4OH/H_2O_2/H_2O$), de-foaming agents, etc. It should be understood that essentially any liquid can be used as longs as the liquid can adequately remove the tri-state body cleaning material and contaminant particles from the substrate 116 surface per the requirements of the application.

Continuing with FIG. 3, the gas dispensing portion 306 is configured to supply a gas to substantially remove liquids from the surface of the substrate 116 after the proximity head portion 304 has substantially removed the tri-state body cleaning materials. Examples of gases that can be dispensed by this portion include isopropyl alcohol (IPA) gas, $CO_2$, air, nitrogen ($N_2$), argon (Ar), oxygen ($O_2$), ozone ($O_3$), etc. Essentially any type of gas can be dispensed as long as the gas can be used to adequately dry the substrate 116 surface without damaging the multi-level structures defined on the substrate 116 surface.

Figure 4:
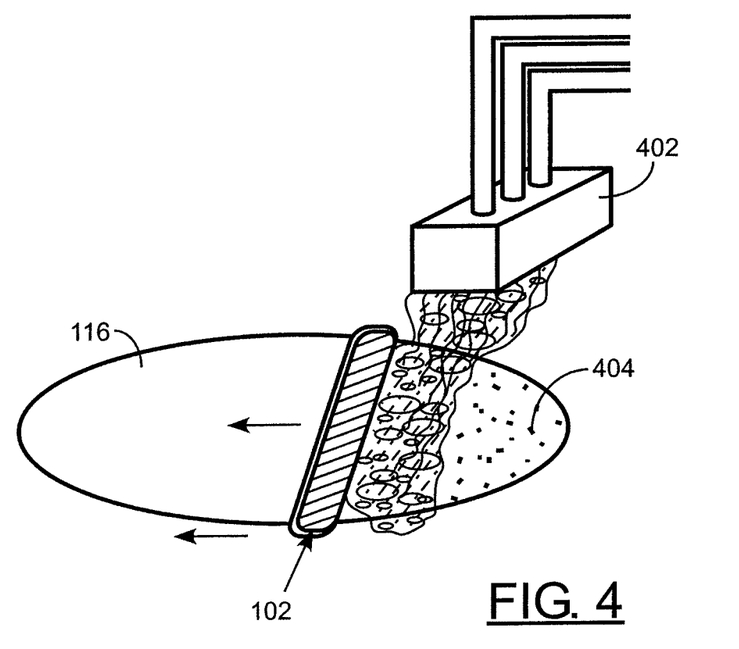
FIG. 4 is an illustration of a non-integrated cleaning apparatus for cleaning the surface of a substrate, in accordance with one embodiment of the present invention.

FIG. 4 is an illustration of a non-integrated cleaning apparatus for cleaning the surface of a substrate, in accordance with one embodiment of the present invention. As depicted, the cleaning apparatus includes a manifold unit 402 and a proximity head unit 102, both configured to operate substantially in unison as they move translationally across the top surface of a substrate 116 during a cleaning operation. In one embodiment the manifold unit 402 and the proximity head unit 102 are combined into an integrated cleaning apparatus. In another embodiment, the manifold unit 402 and the proximity head unit 102 are physically separate units. In one embodiment, during a substrate 116 cleaning operation, the substrate 116 moves translationally across and below first the manifold unit 402 then followed by the proximity head unit 102. The manifold unit 402 is configured to supply the tri-state body cleaning material for cleaning the surface of the substrate 116, whereas the proximity head unit 102 applies liquid and a vacuum to remove the cleaning material off the surface 116 of the substrate.

The manifold unit 402 is positioned proximate to the substrate 116 surface and is configured to dispense a tri-state body cleaning material to that surface. The tri-state body cleaning material may be dispensed as either a foam or an emulsion that includes a plurality of tri-state bodies. In one embodiment, the manifold 402 is configured to supply the tri-state body cleaning material with sufficient force to promulgate interactions between the solid portions of the cleaning material and the contaminant particles 404 on the substrate 116 surface. The interactions between the solid portions of the tri-state bodies and the contaminant particles results in the particle being removed from the surface of the substrate 116 as the tri-state bodies are removed. As disclosed previously, the interactions may be established through one or more mechanisms including adhesion, collision, and attractive forces. As the tri-state body is removed from the substrate 116 surface, so is the contaminant particle 404.

Still with FIG. 4, the proximity head unit 102 is positioned proximate to the surface of the substrate 116 during operation and is configured to form a circulating liquid meniscus on the substrate 116 surface to substantially remove any tri-state body cleaning material and contaminants 404 from the surface. Example of liquids that can be used by the proximity head unit 102 to form the liquid meniscus include, De-ionized Water (DIW), Ammonium Peroxide ($NH_4OH$), Hydrogen Peroxide ($H_2O_2$), SC-1 solution ($NH_4OH/H_2O_2/H_2O$), de-foaming agents, etc. In one embodiment, the proximity head portion 102 further includes gas dispensing outlets that are configured to supply a gas to the surface of the substrate 116. Examples of gases that can be dispensed by these outlets include isopropyl alcohol (IPA) gas, air, nitrogen ($N_2$), argon (Ar), oxygen ($O_2$), ozone ($O_3$), etc. Essentially any type of gas can be dispensed as long as the gas can be used to adequately dry the substrate 116 surface without damaging the multi-level structures defined on the substrate 116 surface.

Figure 5:
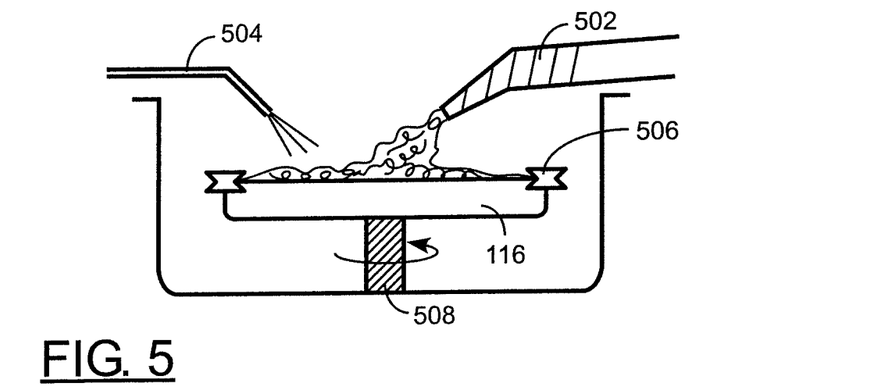
FIG. 5 is a side-view illustration of a system for cleaning a substrate surface, in accordance with one embodiment of the present invention.

FIG. 5 is a side-view illustration of a system for cleaning a substrate surface, in accordance with one embodiment of the present invention. In this depiction, the system includes a tri-state body cleaning material dispenser 502, a liquid dispensing nozzle 504, and a rotating chuck 508. The tri-state body dispenser 502 is positioned adjacent to the liquid dispensing nozzle 504 and proximate to the surface of a substrate 116 being supported by a plurality of substrate clips 506 configured to secure the substrate 116 onto the rotating chuck 508. The clips 506 can take on any number of configurations, and are sometimes referred to as fingers, holders, wheels, rollers, grippers or the like. The configuration of the body that holds the wafer is similar to a spin-rinse-dry module, however, the dispenser 502 of the present invention is calibrated to ensure proper delivery of the tri-state body over the surface of the substrate 116.

As noted, in one embodiment, the tri-state body dispenser 502 is configured to dispense the tri-state body cleaning material in the form of a foam. In another embodiment, the tri-state body dispenser 502 is configured to dispense the tri-state body cleaning material in the form of an emulsion. In one embodiment, the tri-state body material dispenser 502 is configured to dispense the tri-state body cleaning material with sufficient force to promulgate interactions between the solid portions of the cleaning material and the contaminant particles on the substrate 116 surface. The interactions between the solid portions of the tri-state bodies and the contaminant particles results in the particle being removed from the surface of the substrate 116 as the tri-state bodies are removed. In another embodiment, the system further includes a force applicator configured to apply a downward force against the tri-state body cleaning material to promulgate interactions between the solid portion of the material and the contaminant particles on the surface of the substrate 116.

The liquid dispensing nozzle 504 is positioned proximate to the surface of the substrate 116 and is configured to dispense a liquid on to the surface of the substrate 116. Examples of liquids that can be dispensed include De-ionized Water (DIW), Ammonium Peroxide ($NH_4OH$), Hydrogen Peroxide ($H_2O_2$), SC-1 solution ($NH_4OH/H_2O_2/H_2O$), de-foaming agents, etc. However, it should be understood that essentially any liquid can be used as long as the liquid can adequately remove the tri-state body cleaning material from the substrate 116 surface per the requirements of the application.

Still with FIG. 5, the rotating chuck 508 is configured to execute a spin-dry operation whereby the substrate 116 supported by substrate clips 506 attached to the chuck 508 is rotated at a velocity sufficient to substantially remove tri-state body material and/or liquids deposited on the surface of the substrate 116. In one embodiment, instead of using substrate clips 506, the rotating chuck 508 is an electrostatic chuck configured to secure the substrate 116 with sufficient force so that the substrate 116 will remain substantially stationary on the chuck 508 during a spin-dry operation. In another embodiment, instead of using substrate clips 506, the rotating chuck 508 is a vacuum chuck configured to apply a vacuum against the substrate 116 with sufficient intensity so that the substrate 116 will remain substantially stationary during a spin-dry operation.

In an alternative embodiment, the tri-state body can be applied to a stationary substrate using dispensing stream or sheet of fluid. In such a case, the tri-state body can be applied in a form before it begins to foam. The fluid, thus is applied as a stream or sheet onto the surface of the substrate. The drying can also occur using an air blade, such that the surface is left in a dry state. Additionally, a proximity head can be used to perform the dry operation as noted above.

Figure 6:
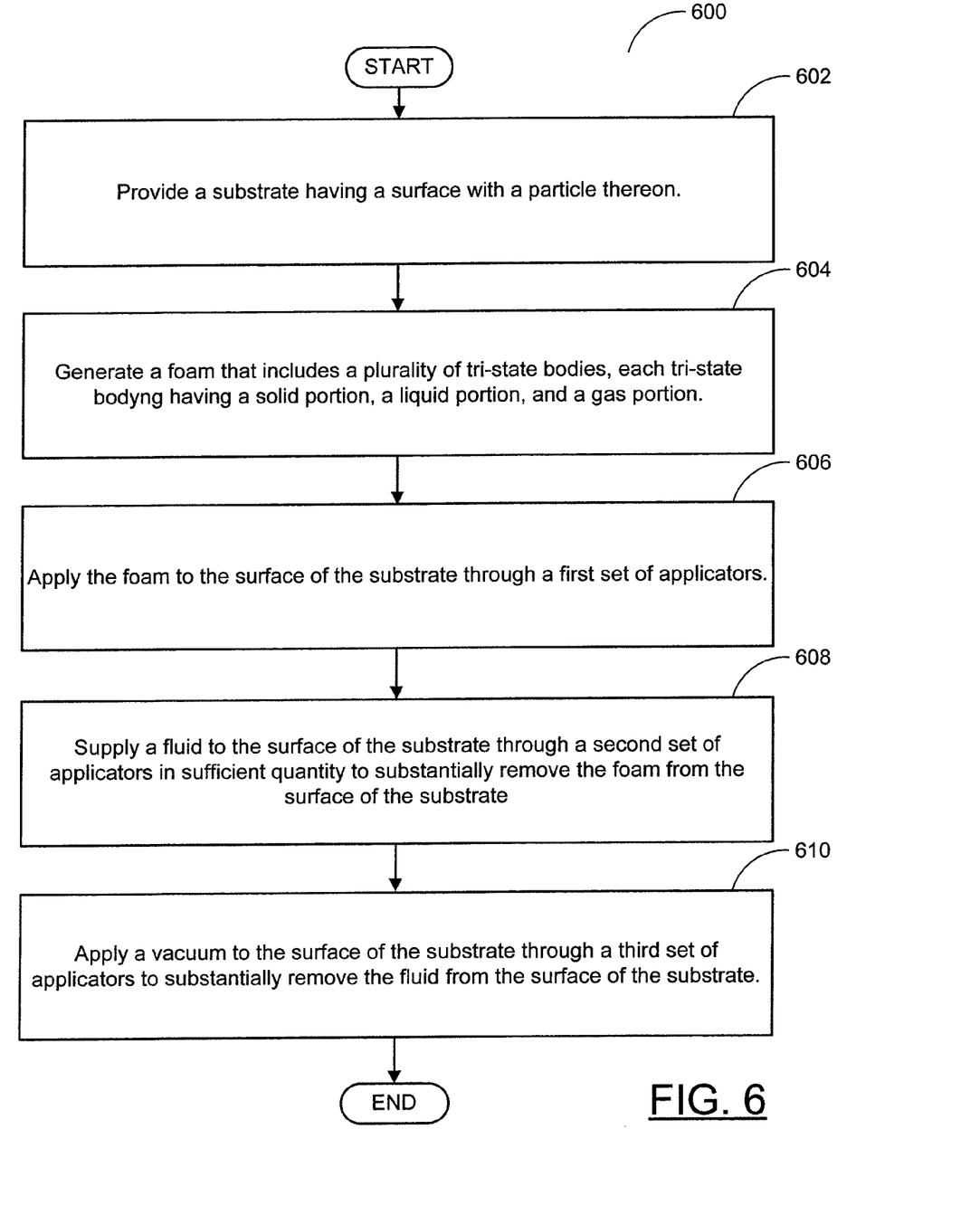
FIG. 6 is a flowchart of a method for cleaning a substrate, in accordance with one embodiment of the present invention.

FIG. 6 is a flowchart of a method for cleaning a substrate, in accordance with one embodiment of the present invention. Diagrams of the cleaning apparatus utilized in this method are shown in FIGS. 1, 2A, 2B, 3, and 4. Method 600 starts with operation 602 where a substrate contaminated with a particle is provided. As discussed previously, the substrate, as an example used herein, denotes without limitation, semiconductor wafers, hard drive disks, optical discs, glass substrates, and flat panel display surfaces, liquid crystal display surfaces, etc. The method 600 continues on to operation 604 where a tri-state body foam is generated. The foam includes a plurality of tri-state bodies each having a solid portion, a liquid portion and a gas portion. For further explanation of the composition of the tri-state body cleaning material and its mechanisms see U.S. patent application Ser. No. 11/346,894, filed on Feb. 3, 2006, entitled "METHOD FOR REMOVING CONTAMINATION FROM A SUBSTRATE AND FOR MAKING A CLEANING SOLUTION".

The method 600 moves on to operation 606 where the tri-state body foam is applied to the surface of the substrate through a first set of applicators. In one embodiment, the first set of applicators is configured to supply the foam with sufficient force to promulgate an interaction between the solid portion of the tri-state body and the particle deposited on the surface of the substrate. The method 600 proceeds on to operation 608 where a fluid is supplied to the surface of the substrate through a second set of applicators in sufficient quantity to substantially remove the foam from the surface of the substrate. Examples of fluids that are appropriate for this operation include De-ionized Water (DIW), Ammonium Peroxide ($NH_4OH$), Hydrogen Peroxide ($H_2O_2$), SC-1 solution ($NH_4OH/H_2O_2/H_2O$), de-foaming agents, etc. It should be appreciated that essentially any liquid can be used as long as the liquid can adequately remove the tri-state body cleaning material from the substrate surface per the requirements of the application.

Still with FIG. 6, the method 600 advances on to operation 610 where a vacuum is applied to the surface of the substrate through a third set of applicators to substantially remove any fluid from the surface of the substrate. In one embodiment, the first and second set of applicators are included in a first head unit and the third set of applicators is included in a second head unit. In another embodiment, the first set of applicators is included in a first head unit and the second and third set of applicators are included in a second head unit. In still another embodiment, the first, second, and third set of applicators are all included in a single integrated head unit.

Figure 7:
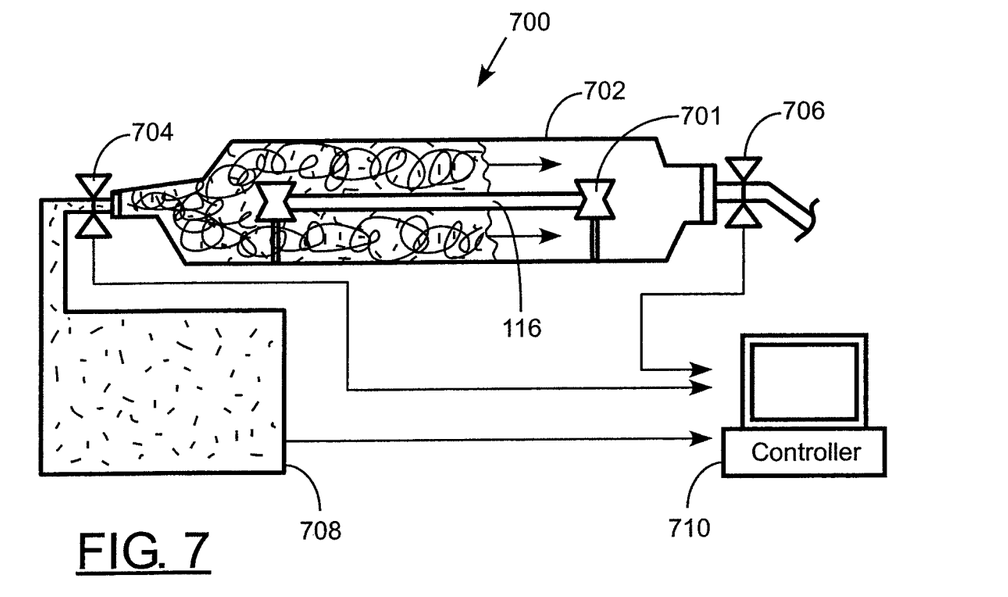
FIG. 7 is a schematic illustration of a pressure-driven flow apparatus for cleaning a substrate, in accordance with one embodiment of the present invention.

FIG. 7 is a schematic illustration of a pressure-driven flow apparatus for cleaning a substrate, in accordance with one embodiment of the present invention. As depicted, the pressure-driven flow substrate cleaning device 700 is comprised of a containment conduit 702 that includes an inlet valve 704, an outlet valve 706, a plurality of substrate grippers 701 and a material reservoir 708. The inlet valve 704 and the outlet valve 706 are respectively configured to regulate the flow of tri-state body cleaning materials and fluids into and out of the containment conduit 700. The tri-state body cleaning material is supplied by a material reservoir 708 operatively attached to the inlet valve 704.

By regulating the inflow and outflow of the tri-state body cleaning material through the containment conduit 700, a force is generated and applied against the tri-state bodies adjacent to the substrate 116 surface to promote interactions between the solid portions of the tri-state bodies and the contaminant particles on the substrate 116 surface. The interactions between the solid portions of the tri-state bodies and the contaminant particles results in the particle being removed from the surface of the substrate 116 as the tri-state bodies are removed. These interactions may be established through one or more mechanisms including adhesion, collision, and attractive forces. The inlet 704 and outlet is 706 valves are controlled by a controller 710 that is operatively connected to both valves. The plurality of substrate grippers 701 enclosed within the containment conduit 700 is configured to support the substrate 116 in an elevated position and provide a restraint for the substrate 116 to prevent any unintentional movements during a cleaning operation.

Continuing with FIG. 7, in one embodiment, the fluid is a gas that functions to dry the substrate 116 and/or supply a force against the tri-state bodies to promulgate interactions between the solid portions of the tri-state bodies and contaminant particles deposited on the surfaces of the substrate 116. A gas source (not depicted in FIG. 7) is operatively attached to the inlet valve 704 to supply the gas to the containment conduit 700. Examples of appropriate gases to use include air, nitrogen ($N_2$), argon (Ar), oxygen ($O_2$), ozone ($O_3$), carbon dioxide ($CO_2$), etc. Essentially any type of gas can be dispensed as long as the gas does not react with tri-state bodies and/or the multi-level structures defined on the substrate 116 surface. In another embodiment, the fluid is a liquid that is used to rinse the tri-state body cleaning material from the substrate 116 surfaces. A fluid reservoir is operatively attached to the inlet valve 116 to supply the fluid to the containment conduit 700. Examples of appropriate liquids include De-ionized Water (DIW), Ammonium Peroxide ($NH_4OH$), Hydrogen Peroxide ($H_2O_2$), SC-1 solution ($NH_4OH/H_2O_2/H_2O$), de-foaming agents, etc. Essentially any liquid can be used as long as the liquid can adequately remove the tri-state body cleaning material and contaminant particle from the substrate 116 surface per the requirements of the application.

Figure 8A:
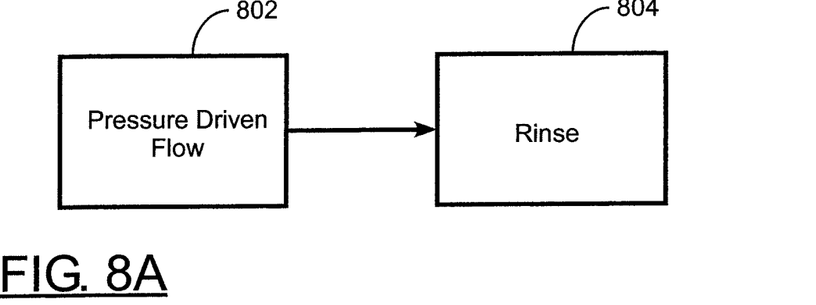
FIG. 8A is a process flow chart of a system for cleaning a substrate, in accordance with one embodiment of the present invention.
Figure 8B:
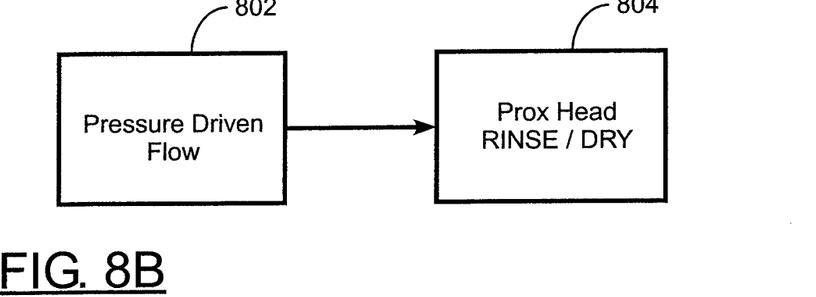
FIG. 8B is a process flow chart of a system for cleaning a substrate, in accordance with one embodiment of the present invention.

FIG. 8A is a process flow chart of a system for cleaning a substrate, in accordance with one embodiment of the present invention. As detailed in this process chart, the substrate is first subjected to a cleaning by a pressure-driven flow cleaning apparatus in a first cleaning zone 802. The pressure-driven flow cleaning apparatus being configured to apply a tri-state body cleaning material to the surface of the substrate in such a manner as to promulgate interactions between the solid portions of the tri-state bodies and the contaminant particles deposited on the substrate surface. The interactions between the solid portions of the tri-state bodies and the contaminant particles results in the particle being removed from the surface of the substrate as the tri-state bodies are removed. After being cleaned by the pressure-driven flow cleaning apparatus, the substrate is moved from the first cleaning zone 802 to a second cleaning zone 804 using a substrate carrier on tracks that connect the first 802 and the second cleaning zones 804. The second cleaning zone 804 includes one or more applicators that are configured to dispense a fluid to substantially rinse and dry any tri-state body material, fluids, and/or contaminant particles remaining on the surface of the substrate. Examples of appropriate liquids to use include, De-ionized Water (DIW), Ammonium Peroxide ($NH_4OH$), Hydrogen Peroxide ($H_2O_2$), SC-1 solution ($NH_4OH/H_2O_2/H_2O$), de-foaming agents, etc. Essentially any liquid can be used as long as the liquid can adequately remove the tri-state body cleaning material and contaminant particle from the substrate surface per the requirements of the application FIG. 8B is a process flow chart of a system for cleaning a substrate, in accordance with one embodiment of the present invention. In this process flow chart, the substrate is first subjected to a cleaning by a pressure-driven flow cleaning apparatus in a first cleaning zone 802. As discussed above, the pressure-driven flow cleaning apparatus is configured to apply a tri-state body cleaning material to the surface of the substrate in such a manner as to promulgate interactions between the solid portions of the tri-state bodies and the contaminant particles deposited on the substrate surface. After being cleaned by the pressure-driven flow cleaning apparatus, the substrate is moved from the first cleaning zone 802 to a second cleaning zone 806 using a substrate carrier on tracks that connect the first 802 and the second cleaning zones 806. The second cleaning zone 806 includes a proximity head unit that is configured to apply a liquid meniscus to rinse any remaining tri-state body cleaning material off the substrate surface and apply a vacuum to dry off leftover liquids on the substrate surface. In one embodiment, the proximity head unit is further configured to supply a gas to enhance drying of the surface of the substrate. Example of appropriate gases to use for this application include IPA vapor, air, nitrogen ($N_2$), argon (Ar), oxygen ($O_2$), ozone ($O_3$).

Figure 9:
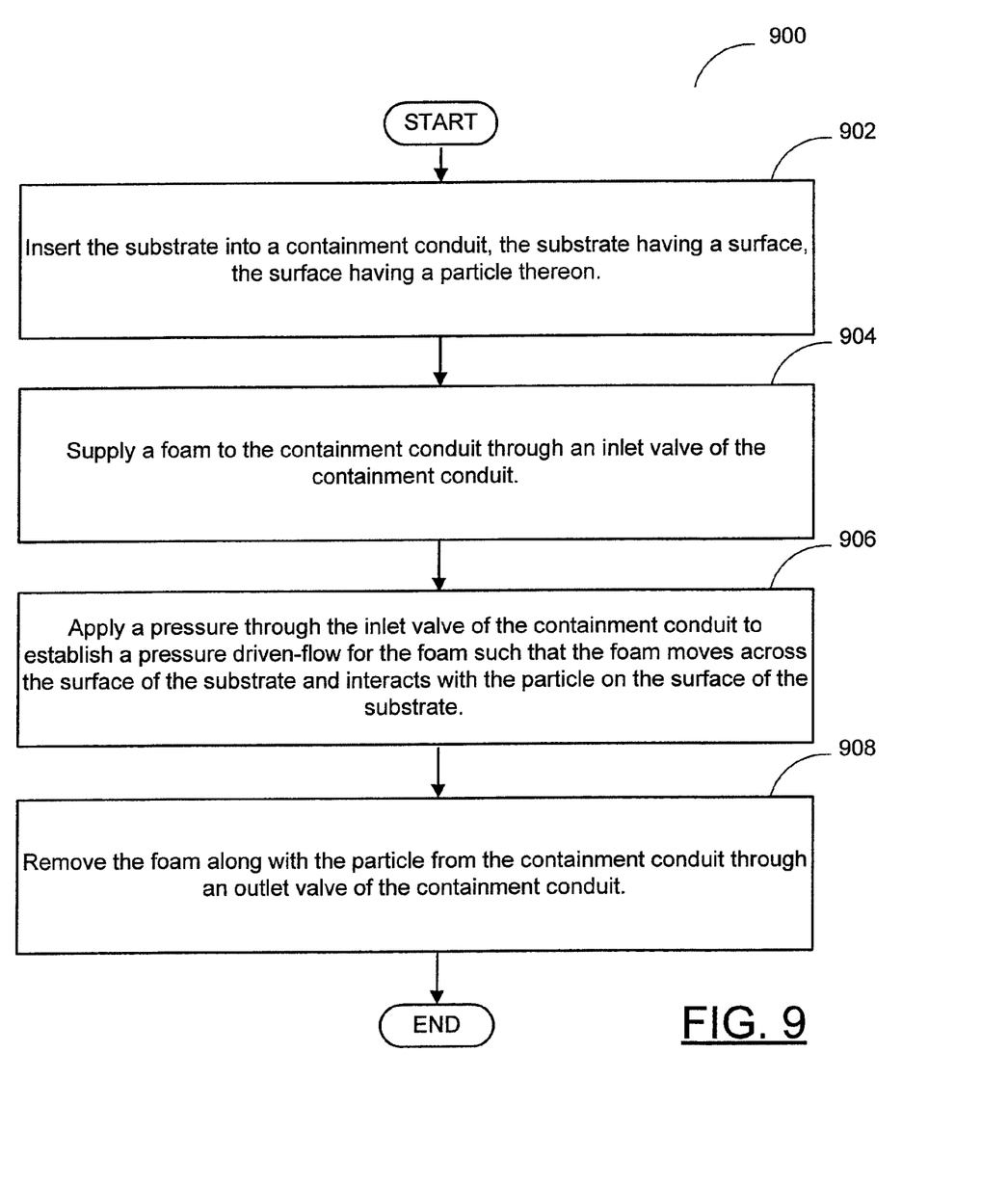
FIG. 9 is a flowchart of a method for cleaning a substrate, in accordance with one embodiment of the present invention.

FIG. 9 is a flowchart of a method for cleaning a substrate, in accordance with one embodiment of the present invention. Diagrams of the cleaning apparatus utilized in this method are shown in FIGS. 7, 8A, and 8B. Method 900 starts with operation 902 where a substrate having a particle deposited thereon is inserted into the containment conduit. As discussed previously, the substrate can be either a semiconductor wafer or a LCD flat panel. The method 900 continues on to operation 904 where a tri-state body foam is supplied to the containment conduit through an inlet valve of the containment conduit. As discussed previously, the tri-state body foam is supplied via a reservoir that is operatively connected to the inlet valve. Also, the tri-state body foam is comprised of a plurality of tri-state bodies each having a solid portion, a liquid portion, and a gas portion.

The method 900 proceeds to operation 906 where a pressure is applied through the inlet valve of the containment conduit to establish a pressure-driven flow for the foam such that the foam moves across the surface of the substrate and interacts with the contaminant particle on the surface of the substrate. As disclosed previously, the solid portions of the tri-state bodies that comprise the foam is the component of the foam that interacts with the contaminant particle. These interactions may be established through one or more mechanisms including adhesion, collision, and attractive forces.

Continuing with FIG. 9, the method 900 advances to operation 908 where the foam is removed along with the particle from the containment conduit through an outlet valve of the containment conduit. The removal of the foam is effectuated by applying a liquid through the inlet valve of the containment conduit to rinse the surfaces of the substrate of the tri-state body foam. The liquid evacuating the containment conduit through the outlet valve. The interactions between the solid portions of the tri-state bodies and the contaminant particles resulting in the particle being removed from the surface of the substrate as the tri-state bodies are removed.

For additional information about proximity heads and methods of using the proximity heads are described in co-owned U.S. patent application Ser. No. 10/834,548 filed on Apr. 28, 2004 and entitled "APPARATUS AND METHOD FOR PROVIDING A CONFINED LIQUID FOR IMMERSION LITHOGRAPHY," which is a continuation in part of U.S. patent application Ser. No. 10/606,022, filed on Jun. 24, 2003 and entitled "SYSTEM AND METHOD FOR INTEGRATING IN-SITU METROLOGY WITHIN A WAFER PROCESS." Additional embodiments and uses of the proximity head are also disclosed in U.S. patent application Ser. No. 10/404,692, filed on Mar. 31, 2003, entitled "METHODS AND SYSTEMS FOR PROCESSING A SUBSTRATE USING A DYNAMIC LIQUID MENISCUS." Additional information with respect to proximity cleaning can be found in U.S. patent application Ser. No. 10/817,355 filed on Apr. 1, 2004 entitled "SUBSTRATE PROXIMITY PROCESSING STRUCTURES AND METHODS FOR USING AND MAKING THE SAME," U.S. patent application Ser. No. 10/817,620 filed on Apr. 1, 2004 entitled "SUBSTRATE MENISCUS INTERFACE AND METHODS FOR OPERATION," and U.S. patent application Ser. No. 10/817,133 filed on Apr. 1, 2004 entitled "PROXIMITY MENISCUS MANIFOLD." The aforementioned patent applications are hereby incorporated by reference in their entirety.

Additional embodiments and uses of the proximity head are also disclosed in U.S. patent application Ser. No. 10/330, 897, filed on Dec. 24, 2002, entitled "SYSTEM FOR SUBSTRATE PROCESSING WITH MENISCUS, VACUUM, IPA VAPOR, DRYING MANIFOLD" and U.S. patent application Ser. No. 10/404,270, filed on Mar. 31, 2003, entitled "VERTICAL PROXIMITY PROCESSOR," U.S. patent application Ser. No. 10/817,398 filed on Apr. 1, 2004 entitled "CONTROLS OF AMBIENT ENVIRONMENT DURING WAFER DRYING USING PROXIMITY HEAD," U.S. Pat. No. 6,488,040, issued on Dec. 3, 2002, entitled "CAPILLARY PROXIMITY HEADS FOR SINGLE WAFER CLEANING AND DRYING," and U.S. Pat.

No. 6,616,772, issued on Sep. 9, 2003, entitled "Methods For Wafer Proximity Cleaning And Drying." Still further, additional embodiments and uses of the proximity head are described in U.S. patent application Ser. No. 10/883,301 entitled "CONCENTRIC PROXIMITY PROCESSING HEAD," and U.S. patent application Ser. No. 10/882,835 entitled "METHOD AND APPARATUS FOR PROCESSING WAFER SURFACES USING THIN, HIGH VELOCITY FLUID LAYER." Further embodiments and uses of the proximity head are further described in U.S. patent application Ser. No. 10/957,260 entitled "APPARATUS AND METHOD FOR PROCESSING A SUBSTRATE," U.S. patent application Ser. No. 10/956,799 entitled "APPARATUS AND METHOD FOR UTILIZING A MENISCUS IN SUBSTRATE PROCESSING" and U.S. patent application Ser. No. 10/957,384 entitled "PHOBIC BARRIER MENISCUS SEPARATION AND CONTAINMENT." The aforementioned patent applications are hereby incorporated by reference in their entirety.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. An apparatus for cleaning a substrate, comprising:
   a manifold unit located at a first vertical position, the manifold unit having a first row of channels defined within the manifold unit and configured to supply a foam to the surface of the substrate when present; and
   a proximity head unit positioned at a second vertical position, the second vertical position being proximate to a surface of the substrate and closer to the surface of the substrate than the first vertical position of the manifold unit when the substrate is present, such that the proximity head unit is below the manifold unit, the proximity head unit having a second row of channels defined within the proximity head unit and configured to supply a fluid to the surface of the substrate when present; and
   a third row of channels defined within the proximity head unit and positioned horizontally between the first and second row of channels such that the first row of channels and the second row of channels are on horizontal opposite sides of the third row of channels, the second row of channels are coupled to a vacuum and oriented over the surface of the substrate when the substrate is present, thereby controlling removal of the foam and the fluid;
   wherein the surface is of one side of the substrate.

2. The apparatus for cleaning a substrate, as recited in claim 1, wherein, the foam is comprised of a plurality of tri-state bodies, the tri-state bodies including a solid portion, a liquid portion, and a gas portion.

3. The apparatus for cleaning a substrate, as recited in claim 2, wherein the solid portion includes fatty acids.

4. The apparatus for cleaning a substrate, as recited in claim 1, wherein, the fluid is one of a gas or a liquid.

5. The apparatus for cleaning a substrate, as recited in claim 4, wherein, if the fluid is the liquid,
   the liquid is one of de-ionized water or a de-foaming agent.

6. The apparatus for cleaning a substrate, as recited in claim 4, wherein, if the fluid is the gas,
   the gas is one of air, ozone ($O_3$), oxygen ($O_2$), nitrogen ($N_2$), and argon (Ar).

7. The apparatus for cleaning a substrate, as recited in claim 1, wherein, the apparatus is configured to move translationally relative to the surface of the substrate.

8. The apparatus for cleaning a substrate, as recited in claim 1, wherein, the proximity head unit further includes a fourth row of channels defined within and configured to supply isopropyl alcohol (IPA) vapor or carbon dioxide (CO2) to the surface of the substrate.

* * * * *